(12) United States Patent
Kubota et al.

(10) Patent No.: US 6,429,134 B1
(45) Date of Patent: Aug. 6, 2002

(54) METHOD OF MANUFACTURING SEMICONDUCTOR DEVICE

(75) Inventors: Takeo Kubota, Kawasaki; Hiroyuki Yano, Yokohama; Kenro Nakamura, Kamakura, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/606,149

(22) Filed: Jun. 29, 2000

(30) Foreign Application Priority Data

Jun. 30, 1999 (JP) ............................................ 11-186990

(51) Int. Cl.[7] .......................................... H01L 21/302
(52) U.S. Cl. ..................... 438/692; 438/693; 438/750; 438/5; 438/14; 216/88; 216/89; 216/84; 216/105; 216/18
(58) Field of Search ................................ 438/692, 693, 438/750, 751, 5, 14; 216/88, 89, 84, 105, 18, 19

(56) References Cited

U.S. PATENT DOCUMENTS

| | | | | |
|---|---|---|---|---|
| 5,665,202 A | * | 9/1997 | Subramanian et al. ...... | 438/692 |
| 5,985,748 A | * | 11/1999 | Watts et al. ................ | 438/622 |
| 6,083,840 A | * | 7/2000 | Mravic et al. .............. | 438/693 |
| 6,106,662 A | * | 8/2000 | Bibby, Jr. et al. ........... | 156/345 |
| 6,276,987 B1 | * | 8/2001 | Li et al. ......................... | 451/5 |
| 6,165,052 A1 | * | 12/2001 | Yu et al. ....................... | 451/41 |

FOREIGN PATENT DOCUMENTS

| | | | |
|---|---|---|---|
| JP | 10-128655 | | 5/1998 |
| JP | 2000091415 | * | 3/2000 |

* cited by examiner

Primary Examiner—George Goudreau
(74) Attorney, Agent, or Firm—Finnegan, Henderson, Farabow, Garrett & Dunner, L.L.P.

(57) ABSTRACT

A method of manufacturing a semiconductor device, which comprises the steps of providing a substrate having a groove on the surface thereof, forming a burying film on the substrate to thereby fill the groove with the burying film, performing a first polishing step to polish the burying film by means of a CMP method, the polishing being suspended before the substrate is exposed, and performing a second polishing step to polish the burying film by means of a CMP method until part of the burying film which is disposed outside the groove is removed. The time to finish polishing of the second polishing step is determined based on a film thickness of the burying film which is left remained after finishing the first polishing step. The first polishing step may be performed under a condition which differs from that of the second polishing step.

16 Claims, 5 Drawing Sheets

METHOD OF MANUFACTURING SEMICONDUCTOR DEVICE

CROSS-REFERENCE TO RELATED APPLICATIONS

This application is based upon and claims the benefit of priority from the prior Japanese Patent Application No. 11-186990, filed Jun. 30, 1999, the entire contents of which are incorporated herein by reference.

BACKGROUND OF THE INVENTION

This invention relates to a method of manufacturing a semiconductor device, which includes a polishing step by means of a CMP (Chemical Mechanical Polishing) method.

In the field relating to the manufacture of semiconductor device in recent years, due to a prevailing trend to further enhance the integration and performance of a semiconductor device, various fine processing techniques have been studied and developed. Among them, the aforementioned CMP method is one of the essential techniques, which is indispensable for forming a buried structure such as a buried metallic wiring or a buried element isolation.

The buried structure of this kind, for example a buried metallic wiring has been conventionally formed by making use of the CMP as follows. Namely, a stopper film is deposited on the surface of an interlayer insulating film, and then, these stopper film and interlayer insulating film are patterned to form a wiring groove. Thereafter, a metallic film is deposited over the interlayer insulating film to a thickness larger than the depth of the wiring groove. After the polishing time required for achieving the just-polishing of the metallic film is estimated from the initial film thickness of the metallic film, the metallic film is subjected to a polishing by means of the CMP method for this estimated time period (i.e. the estimated just-polishing time), thereby selectively removing the redundant portion of the metallic film which is disposed outside the wiring groove, leaving only the metallic film which is disposed inside the wiring groove, thus forming a buried metallic wiring.

However, this conventional method of forming a buried wiring is accompanied with the following problems. Namely, due to a difference in polishing rate depending on individual property of wafer or due to the changes of the polishing rate during the polishing treatment, it is impossible to minimize a difference between the polishing time required for actually achieving the just-polishing (actual polishing time) and the estimated just-polishing time, thus resulting in an over-polishing and hence, giving rise to an enlarged dishing.

Additionally, due to non-uniformity of film thickness and of polishing rate in the same film formed on a wafer, there is a possibility that even if the formation of buried wiring may have been finished processing at some locations of the same wafer as a result of the polishing, but the formation of buried wiring may not have been finished processing yet at other locations. In such a case, it may be required to set the actual polishing time longer than the polishing time t1 of the portion of wafer where the formation of buried wiring can be finished processing at first.

Generally, the actual polishing time is set longer by a ratio of 30 to 50% than the polishing time t1 of the portion of wafer where the formation of buried wiring can be finished at first, so that if the time t1 is 180 seconds, the over-polishing time would become 54 to 90 seconds. Namely, the portion of wafer where the formation of buried wiring can be finished at first would be excessively polished for this over-polishing time.

Therefore, if a buried wiring having a narrow wiring interval and a buried wiring having a wide wiring interval are co-existed in a single wafer, a large erosion would be caused to generate at the region of the buried wiring having a narrow wiring interval where processing has been finished at first. Additionally, if a buried wiring having a narrow line width and a buried wiring having a wide line width are co-existed in a single wafer, a large dishing would be caused to generate at the region of the buried wiring having a wide line width where processing has been finished at first. These phenomena would become more serious as the integration of semiconductor device and the fineness of semiconductor devices are further promoted.

FIGS. 1A and 1B illustrate the characteristics of the CMP method that has been conventionally employed in the formation of a buried wiring. If a buried wiring is to be formed, a relatively thick metal film is deposited at first, and then, the metal film is polished by means of the CMP method exhibiting a high load dependency (as shown in FIG. 1A, the CMP rate changes depending on the magnitude of load). In this case however, once the polishing surface becomes flat, the CMP rate would be sharply decreased. Further, when the metal film is deposited thinner, the possibility of generating the dishing would be increased.

As explained above, the conventional method of forming a buried wiring by means of the CMP method is accompanied with the problems that, since it is impossible to minimize a difference between an actual polishing time and an estimated just-polishing time, the actual polishing is inevitably resulted in an over-polishing, thereby raising the problems of erosion and enlarged dishing.

BRIEF SUMMARY OF THE INVENTION

Therefore, an object of this invention is to provide a method of manufacturing a semiconductor device, which is capable of suppressing the generation of erosion and dishing even if an over-polishing is performed on the occasion of forming a buried structure by means of CMP method.

Namely, this invention provides a method of manufacturing a semiconductor device, which comprises the steps of providing a substrate having a groove on the surface thereof, forming a burying film on the substrate to thereby fill the groove with the burying film, performing a first polishing step to polish the burying film by means of a CMP method, the polishing being suspended before the substrate is exposed, and performing a second polishing step to polish the burying film by means of a CMP method until part of the burying film which is disposed outside the groove is removed.

Further, according to this invention, there is also provided a method of manufacturing a semiconductor device, which comprises the steps of providing a substrate having a groove on the surface thereof, forming a burying film on the substrate to thereby fill the groove with the burying film, performing a first polishing step to polish the burying film by means of a CMP method, the polishing being suspended before the substrate is exposed, determining a polish-finishing time of a second polishing step on the basis of a film thickness of the burying film after the suspension of the first polishing step, and performing a second polishing step to polish the burying film by means of a CMP method until the polish-finishing time determined in the previous step runs out.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

This invention is featured in that the polishing of a burying film is performed in two stages by the CMP method, i.e. a first polishing step to polish the burying film by means of a CMP method, the polishing being suspended before the substrate is exposed, and performing a second polishing step to polish the burying film by means of a CMP method until part of the burying film which is disposed outside the groove is removed.

In this case, the polish-finishing time of the second polishing step can be determined on the basis of a film thickness of the burying film left after finishing the first polishing step. Further, it is also possible to differ the polishing conditions of the second polishing step from those of the first polishing step.

Figure 1A:
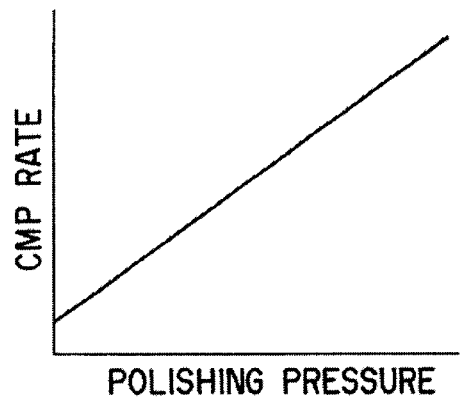
FIGS. 1A and 1B show respectively a graph schematically illustrating the characteristics of CMP method to be employed in the formation of a buried wiring according to the prior art.
Figure 1B:
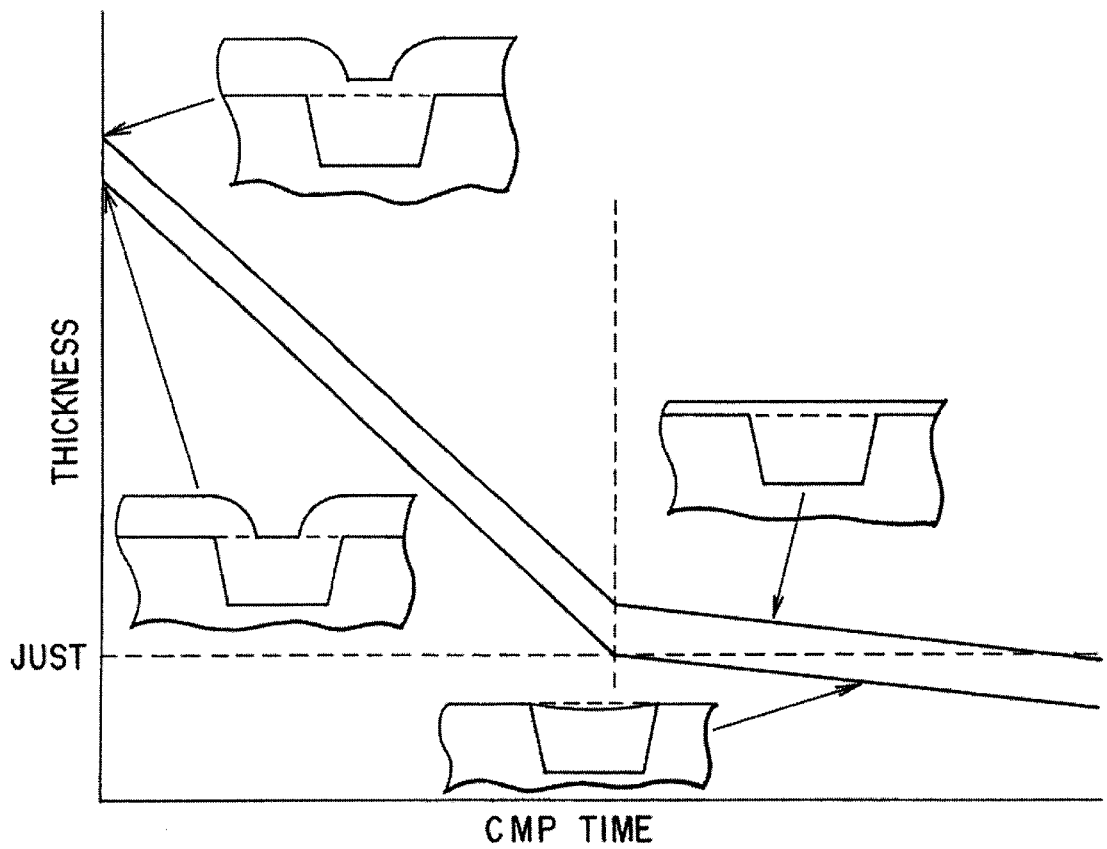
Figure 2:
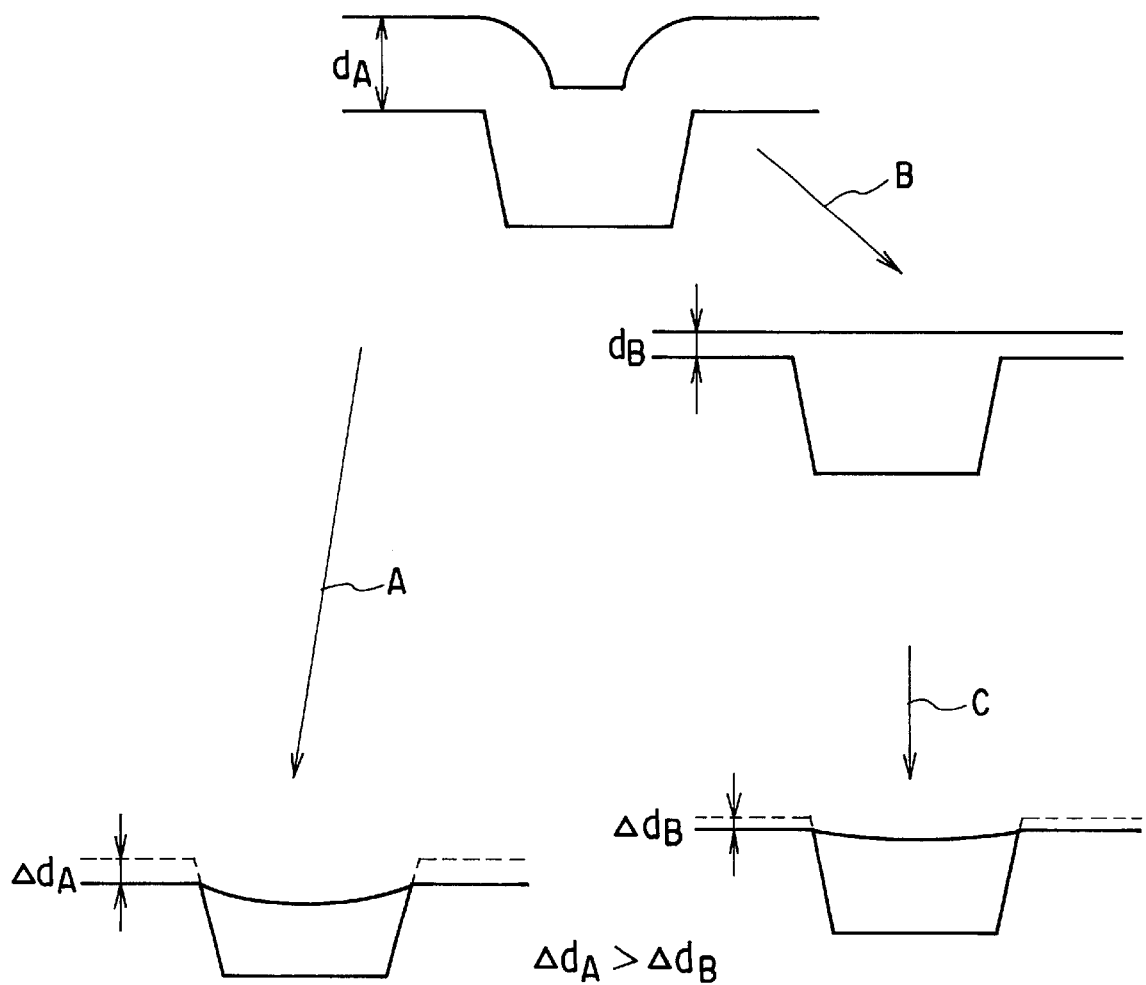
FIG. 2 illustrates a diagram for explaining the effects to be derived from this invention.

As seen from the sequence indicated by the arrow A in FIG. 2, according to the prior art, a film to be polished (i.e. a polishing film) is deposited in such a manner that the minimum thickness over the groove becomes larger than the depth of the groove, after which the burying film is polished by a single polishing step until the underlying layer is exposed as shown by the arrow A. Further, the time of terminating the polishing step has been estimated based on the initial thickness $\Delta dA$ of the burying film.

Whereas in the method of this invention, as seen from the sequence indicated by the arrows B and C in FIG. 2, since the polishing of burying film is performed by two polishing steps until the underlying film is exposed, the time to terminate the entire polishing process can be estimated based on the film thickness dB of the burying film prior to initiating the second polishing step (the second polishing step).

Therefore, according to this invention, since the time to terminate the entire polishing process can be determined based on the film thickness of burying film which is substantially thinner than that of the conventional method, it is now possible to minimize a difference between the actual just-polishing time and the estimated just-polishing time. As a result, as shown in FIG. 2, the magnitude of dishing $\Delta dB$ to be generated by the over-polishing according to this invention can be minimized as compared with the magnitude of dishing $\Delta dA$ to be generated by the conventional method.

Further, according to this invention, the initial polishing step (the first polishing step) is performed until the surface of the burying film is flattened, and then, the next polishing step (the second polishing step) is performed in such a manner that after the underlying substrate portion which is located outside the groove is exposed as a result of polishing, the polishing rate of the underlying substrate portion thus exposed can be controlled almost identical with the polishing rate of the burying film.

As a result, even if an over-polishing is performed on a substrate having a mixed buried structure comprising varied groove intervals or varied groove widths, the entire buried structure can be simultaneously exposed and hence, the entire surface thus exposed can be polished at almost the same polishing rate. Therefore, the difference, if any, between the actual just-polishing time and the estimated just-polishing time can be minimized, and at the same time, even if an over-etching is performed on a substrate having a mixed buried structure comprising varied groove intervals or varied groove widths, it is possible to dispense with the generation of intensive erosion and dishing.

Next, various examples of this invention will be explained with reference to the drawings.

EXAMPLE 1

FIGS. 3A to 3E respectively shows a cross-sectional view illustrating the process of forming an element isolation structure according to a first example of this invention. In this example, an element isolation structure according to STI (Shallow Trench Isolation) will be explained.

Figure 3A:
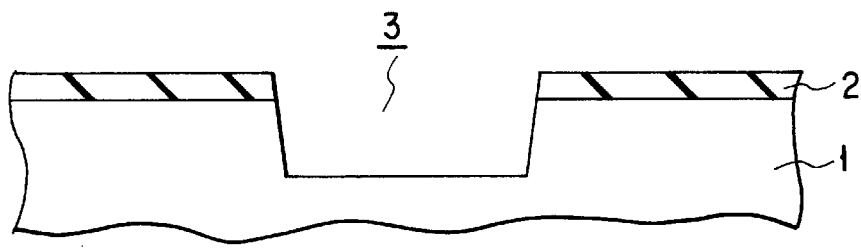
FIGS. 3A, 3B, 3C, 3D and 3E respectively shows a cross-sectional view illustrating the process of forming an element isolation structure according to a first example of this invention.

First of all, as shown in FIG. 3A, a silicon nitride film 2 was formed as a stopper film on the surface of a silicon substrate 1 provided therein elements (not shown). Then, the silicon nitride film 2 and the silicon substrate 1 were etched to form an element isolation groove 3. In this example, the film thickness of the silicon nitride film 2 was set to 50 nm and the depth of the element isolation groove 3 was set to 200 nm.

Figure 3B:
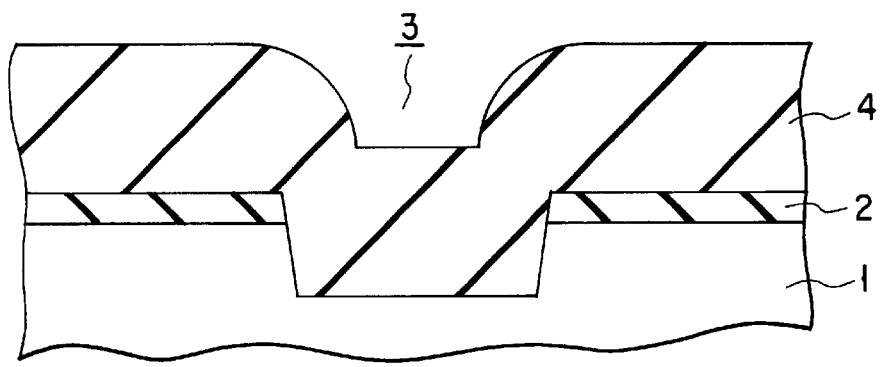

Then, as shown in FIG. 3B, an $SiO_2$ film 4 was deposited all over the top surface of the silicon substrate 1 to a thickness of 350 nm. As a result, as shown in FIG. 3B, the element isolation groove 3 was buried with the $SiO_2$ film 4.

Figure 3C:
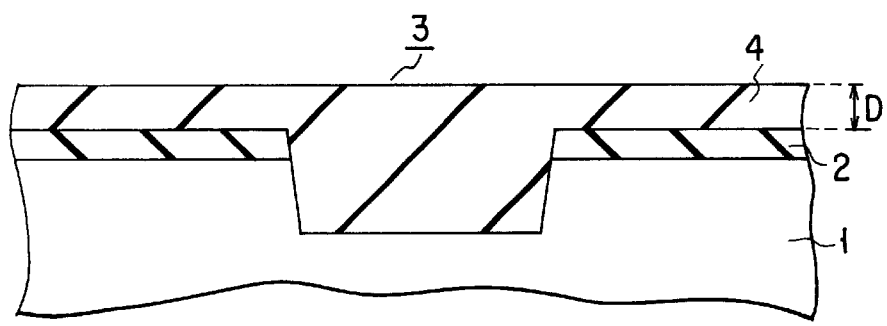

Thereafter, as shown in FIG. 3C, the $SiO_2$ film 4 was polished by means of the CMP method up to a point immediately before the silicon nitride film 2 was exposed so as to eliminate the step portion (recessed and projected portion) of the $SiO_2$ film 4 (the first polishing step). The abrasive slurry employed in this example was formed of the following composition.

The Composition of the Abrasive Slurry:
Solvent: Water
Abrasive grain: silica, 30 nm in particle diameter, and 10% by weight in mixing ratio, SC-1 (trade mark, manufactured by Cabot Co., Ltd.).

As for the abrasive pad, IC1000/SUBA400 (Rodel Nitta Co., Ltd.) was employed. As a result of this first polishing step, the film thickness left remained (residual film thickness) D was reduced to 50 to 100 nm.

The determination of existence or non-existence of step portion (recessed and projected portion) of the $SiO_2$ film 4 could be determined based on changes in current of turn table motor or of top ring motor. Further, since the residual film thickness D of the $SiO_2$ film 4 was not required to be accurately controlled, the determination of existence or non-existence of step portion (recessed and projected portion) of the $SiO_2$ film 4 could be determined based also on the polished time.

Next, the residual film thickness D of the $SiO_2$ film 4 was measured, and based on this measurement, the time for additional polishing is determined. For the purpose of enhancing the throughput, the measurement of the residual film thickness D should preferably be performed by installing a film-measuring apparatus in the polishing apparatus. Alternatively, the measurement of the residual film thickness D can be performed based on an initial film thickness, polishing rate and polishing time of the $SiO_2$ film 4.

Figure 3D:
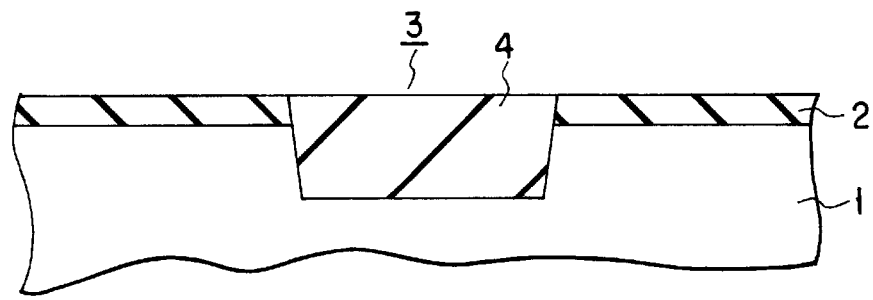

Then, as shown in FIG. 3D, the $SiO_2$ film 4 was subjected to a polishing treatment by means of the CMP method with the silicon nitride film 2 being employed as a stopper film for the time period of additional polishing that had been determined (the second polishing step). In this second polishing step, the same abrasive slurry that had been employed in the first polishing step could be employed.

Figure 3E:
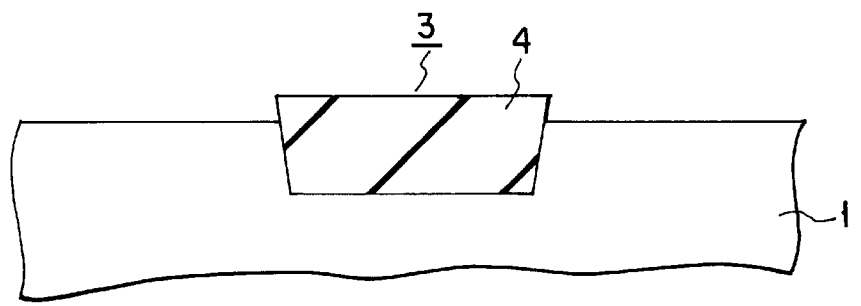

Finally, as shown in FIG. 3E, the silicon nitride film 2 was removed in the same manner as conventionally employed to thereby finishing the formation of an element isolation structure.

According to the conventional method using the CMP method for forming an element isolation structure, the $SiO_2$ film 4 having a thickness of 350 nm for instance is continuously polished by a single step of CMP processing until the silicon nitride film 2 is exposed, and the time to finish the polishing is estimated based on the initial film thickness of the $SiO_2$ film 4.

Whereas according to the method of this example, since the polishing of the $SiO_2$ film 4 was performed by two polishing steps until the silicon nitride film 2 was exposed, the time to terminate the polishing process could be estimated based on the film thickness of the $SiO_2$ film 4 prior to initiating the second polishing step (the second polishing step).

Therefore, according to the method of this example, since the time to terminate the polishing process can be determined based on the film thickness of the $SiO_2$ film 4 which is made substantially thinner than that of the conventional method, it is now possible to minimize a difference between the actual just-polishing time and the estimated just-polishing time. As a result, the over-polishing time can be minimized as compared with the conventional method.

Specifically, since the residual film thickness D (50 to 100 nm) is determined at the end of the first polishing step, the over-polishing time can be reduced to 1/5 to 1/10 of that of the conventional method.

Therefore, even if the over-polishing is performed in the method of this example, the dishing of the $SiO_2$ film 4 can be minimized. By the way, when an element isolation groove of relatively large width and an element isolation groove of relatively narrow width are co-existed in a substrate, the dishing usually becomes more prominent at the element isolation groove of relatively large width rather than at the element isolation groove of relatively narrow width. However, according to the method of this example, the magnitude of dishing even at the element isolation groove of relatively large width can be minimized as compared with the conventional method. Since it is possible, as mentioned above, to realize the formation of element isolation structure where the dishing is suppressed, the property of the resultant element can be improved.

Further, since the measurement of film thickness is performed after finishing the first polishing step, the non-uniformity of film thickness after the first polishing step can be substantially disregarded in this polishing process, so that a silica slurry can be used in this first CMP step.

By the way, in this example, although the same abrasive slurry was employed in both first CMP step and second CMP step, the slurry to be employed in these first and second CMP steps may not be the same. For example, when the suppression of dishing is the main point to be dealt with, a silica-based abrasive slurry as shown below can be preferably employed in the second CMP step so as to minimize the polishing rate of the $SiO_2$ film 4 in relative to the silicon nitride film 2.

Solvent: Water

Abrasive grain: silica, 30 nm in particle diameter, and 5% by weight in mixing ratio, SC-1 (trade mark, manufactured by Cabot Co., Ltd.).

Phosphoric acid: 2.5 wt %

EXAMPLE 2

FIGS. 4A to 4D respectively shows a cross-sectional view illustrating the process of forming a cap insulating film in an SAC (self-alignment contact) process.

Figure 4A:
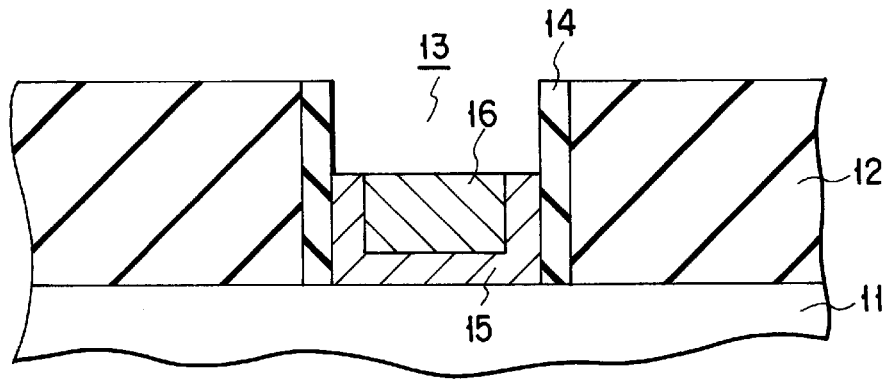
FIGS. 4A, 4B, 4C and 4D respectively shows a cross-sectional view illustrating the process of forming a cap insulating film in an SAC process.

First of all, by following the known method (Japanese Patent Application H8-183336), a wiring structure as shown in FIG. 4A was formed. Referring to FIG. 4A, the reference number 11 denotes a silicon substrate, 12 denotes a silicon oxide film, 13 denotes a wiring groove, 14 denotes a silicon nitride film functioning as a spacer, 15 denotes a Ti/TiN liner film, and 16 denotes a W wiring. In this example, the W wiring 16 was formed in such a manner that the top surface thereof was disposed at a level which was lower by 220 nm than the opening level of the wiring groove 13.

Figure 4B:
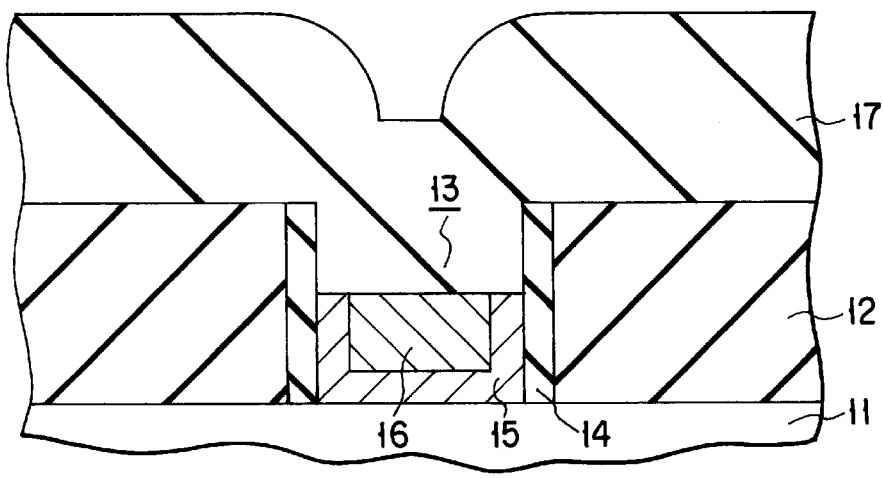

Then, as shown in FIG. 4B, a silicon nitride film (a cap insulating film) 17 was deposited all over the top surface of the silicon substrate 11 to a thickness of 300 nm. As a result, as shown in FIG. 4B, the wiring groove 13 was buried with the silicon nitride film 17.

Figure 4C:
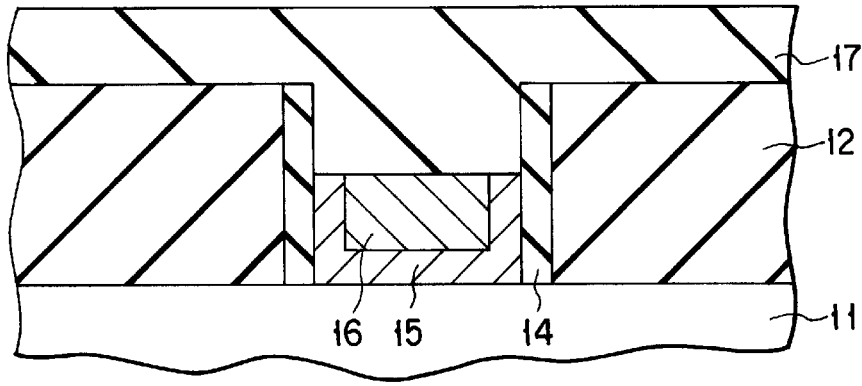

Thereafter, as shown in FIG. 4C, the silicon nitride film 17 was polished by means of the CMP method up to a point immediately before the silicon oxide film 12 was exposed so as to eliminate the step portion (recessed and projected portion) on the surface of the silicon nitride film 17 (the first polishing step).

The abrasive slurry employed in this example was formed of the following composition.

The Composition of the Abrasive Slurry:

Solvent: Water

Abrasive grain: fumed silica, 10 nm in particle diameter, and 5% by weight in mixing ratio.

Phosphoric acid: 2.5 wt %

As for the abrasive pad, IC1000/SUBA400 (Rodel Nitta Co., Ltd.) was employed. The load was set to 400 g/cm$^2$, and the rotational speed of the top ring and the turn table was set to 50 rpm.

As a result of this polishing, the polishing rate of the silicon nitride film having a surface provided with a recessed and projected pattern became 60 nm/min. Whereas, the polishing rate of the silicon nitride film having a flat surface became 15 nm/min. Namely, due to the first polishing step, the surface of the silicon nitride film 14 could be flattened within a short period of time.

Figure 4D:
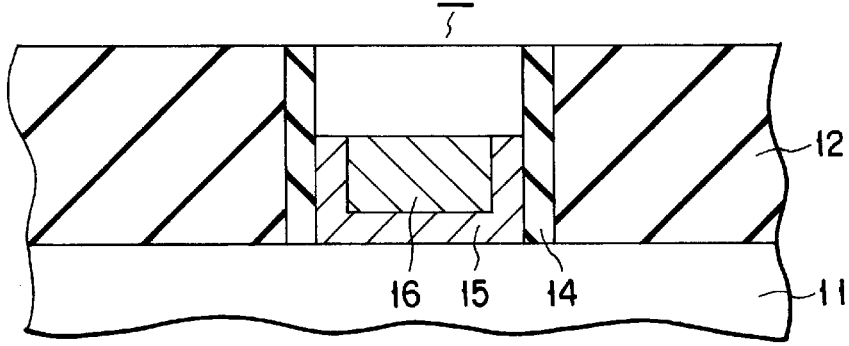

Finally, as shown in FIG. 4D, the rotational speed of the top ring as well as of the turn table was changed to 75 rpm, after which the silicon nitride film 17 was polished by means of the CMP method until the excessive silicon nitride film 17 which was disposed outside the wiring groove 13 could be completely removed (the second polishing step). The abrasive slurry to be employed in this second polishing step may be the same as employed in the first polishing step.

Since the polishing rate of the silicon nitride film 17 having a flat surface became 60 nm/min in the second polishing step, any excessive silicon nitride film 17 could be removed within a short period of time.

However, since the load dependency of the polishing rate is minimal in the second polishing step, if the polishing is performed under the same condition as that of the second polishing step from the beginning, the region where the wiring line width is relatively large would be excessively polished. On the contrary, if the first polishing step is continued throughout the entire polishing process, as the polishing rate is caused to decrease after the moment where the polishing surface is flattened, it would take a long time for completely removing the part of the silicon nitride film 17 which is located outside the groove 13, thus deteriorating the throughput.

Accordingly, if the polishing of the silicon nitride film 17 is performed by two steps of CMP method as described in this example, it becomes possible to obtain a buried structure of the silicon nitride film 17 having excellent flatness within a short period of time as compared with the case where the polishing is performed by a single step of CMP method.

Furthermore, since it is possible to minimize a difference between the actual just-polishing time and the estimated just-polishing time just like Example 1, even if the over-polishing is performed or even if there is various kinds of wiring grooves 13 differing in line width from each other are coexisted in a single substrate, the magnitude of dishing can be minimized.

EXAMPLE 3

Figure 5A:
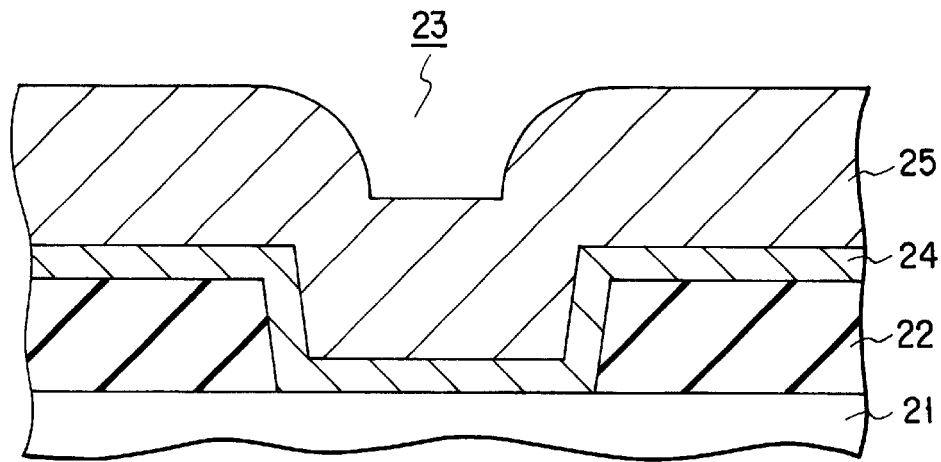
FIGS. 5A, 5B and 5C respectively shows a cross-sectional view illustrating the process of forming a damascene wiring according to a third and fourth examples of this invention.
Figure 5B:
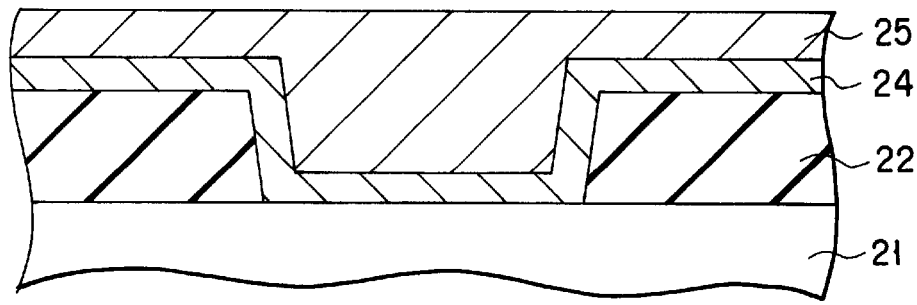
Figure 5C:
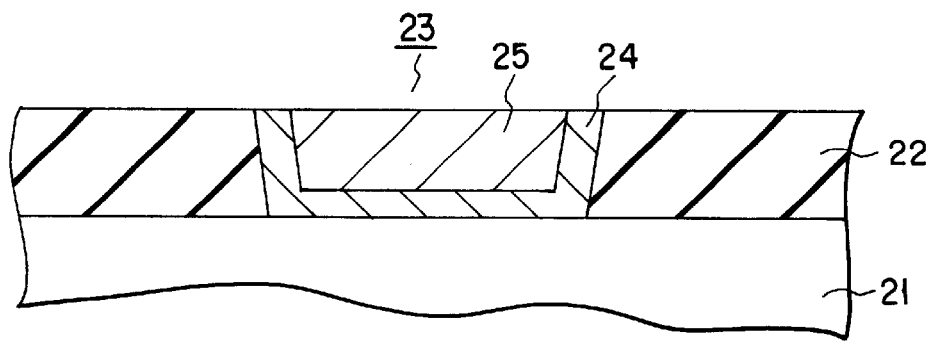

FIGS. 5A to 5C respectively shows a cross-sectional view illustrating the process of forming a damascene wiring according to a third example of this invention. In this example, a Cu damascene wiring employing Cu as a wiring material will be explained.

First of all, as shown in FIG. 5A, an interlayer insulating film 22 was deposited on a silicon substrate 21 having an interlayer insulating film (not shown) in which a plug was embedded. Then, a wiring groove 23 having a depth of 400 nm was formed in the interlayer insulating film 22. By the way, although a single damascene wiring is explained in this example, this invention is also applicable to the formation of a dual damascene wiring.

Then, as shown in FIG. 5A, a TaN liner film 24 having a thickness of 30 nm was formed by means of sputtering method so as to cover the inner wall of the wiring groove 23, which was followed by the deposition of a Cu film 25 having a thickness of 600 nm on the surface of the TaN liner film 24 by means of CVD method.

Thereafter, as shown in FIG. 5B, the Cu film 25 was polished by means of the CMP method up to a point immediately before the TaN liner film 24 was exposed so as to eliminate the step portion (recessed and projected portion) on the surface of the Cu film 25 (the first CMP step). This first polishing step was aimed at eliminating the step portion, so that the CMP method was performed under a condition where a high flattening efficiency can be obtained. Specifically, a hard polishing pad was employed, and a slurry of aqueous solution of hydrogen peroxide/quinaldinic acid/alumina type was employed. The polishing time was set to three minutes. By the polishing under such conditions, the step portions could be substantially eliminated, leaving a residual layer of the Cu film 25 having a thickness of about 100 nm.

Finally, as shown in FIG. 5C, together with the employment of a soft polishing pad, a slurry which was capable of making the polishing rate of the Cu film 25 almost identical with the polishing rate of the TaN liner film 24, for example a slurry comprising a mixed crystal particle consisting of alumina and silica was employed to polish the Cu film 25 and the TaN liner film 24 by means of the CMP method (the second CMP step), thereby finishing the formation of the Cu damascene wiring.

According to the conventional method, the Cu film 25 is polished by a single CMP process until the interlayer insulating film 22 and the TaN liner film 24 are exposed. In this case, since the TaN liner film 24 which is low in polishing rate than the Cu film 25 is co-existed, a relatively large dishing is caused to generate in the Cu film 25. Whereas according to the method of this example, since the polishing of the TaN liner film 24 and the Cu film 25 is performed by two polishing steps until the interlayer insulating film 22 is exposed, the time to terminate the polishing process can be estimated based on the film thickness of the Cu film 25 prior to initiating the second polishing step (the second polishing step).

Therefore, according to the method of this example, since the time to terminate the polishing process can be determined based on the film thickness of the Cu film 25 which is substantially thinner than that of the conventional method, it is now possible to minimize a difference between the actual just-polishing time and the estimated just-polishing time. As a result, the over-polishing time can be minimized as compared with the conventional method.

Specifically, since the residual film thickness of the Cu film 25 can be reduced to 100 nm or less (about ⅙ of that of the conventional method) at the end of the first polishing step, the over-polishing time can be reduced to not more than ⅙ of that of the conventional method.

Therefore, even if the over-polishing is performed or even if there is various kinds of wiring grooves 23 differing in line width from each other are coexisted in a single substrate, the magnitude of dishing of the Cu film 25 can be minimized. Further, even if there is various kinds of wiring grooves 23 differing in wiring intervals (wiring density) from each other are coexisted in a single substrate, the generation of erosion can be suppressed.

Further, since a soft polishing pad is employed in the second CMP step according to the method of this example, the generation of scratch on the surface of the Cu film 25 can be effectively suppressed. Since not only the erosion and dishing can be minimized but also the generation of scratch can be suppressed as explained above, it is possible to obtain a Cu damascene wiring excellent in reliability.

EXAMPLE 4

This example explains the method of forming an Al damascene wiring. By the way, since the cross-sectional views in this example are the same as FIGS. 5A to 5C employed in the explanation of Example 3, this example will be explained with reference to FIGS. 5A to 5C wherein the TaN liner film is substituted by a Nb liner film and the Cu film 25 is substituted by an Al film 25.

First of all, as shown in FIG. 5A, an interlayer insulating film 22 was deposited on a silicon substrate 21 having an element (not shown) formed therein. Then, a wiring groove 23 having a depth of 500 nm was formed in the interlayer insulating film 22. Then, as shown in FIG. 5A, a Nb liner film 24 having a thickness of 30 nm was formed so as to cover the inner wall of the wiring groove 23, which was followed by the deposition of an Al film 25 having a thickness of 800 nm on the surface of the Nb liner film 24 by means of CVD method.

Thereafter, as shown in FIG. 5B, the Al film 25 was polished by means of the CMP method up to a point immediately before the Nb liner film 24 was exposed so as to eliminate the step portion (recessed and projected portion) on the surface of the Al film 25 (the first CMP step).

In this example, the Al film 25 was polished removing a thickness of about 600 nm from the original thickness thereof by making use of a cerium oxide grinding stone as a grinding stone and also by making use of pure water. The polishing by means of the CMP method using the cerium oxide grinding stone can be distinguished from the CMP method using a polishing pad made of a resin in the respect that since the elastic deformation to be generated by the polishing pressure is minimal, the polishing rate at the recessed portion is low as compared with the polishing rate at the projected portion, thereby making it possible to perform an excellent work for flattening. Therefore, even if there is various kinds of damascene wirings differing in line width or in wiring intervals (wiring density) from each other are coexisted on a single substrate, the Al film 25 can be easily flattened.

Finally, as shown in FIG. 5C, together with the employment of a soft polishing pad such as Supreme RN-H (Rodel Nitta Co., Ltd.), a slurry which was capable of making the polishing rate of the Al film 25 almost identical with the polishing rate of the Nb liner film 24, for example a slurry comprising 0.5 wt % of alumina and 0.5% aqueous solution of hydrogen peroxide was employed to polish out redundant portions of the Al film 25 and the Nb liner film 24 which were located outside the wiring groove 23 by means of the CMP method (the second CMP step), thereby finishing the formation of the Al damascene wiring.

This second CMP step functioned also as a touch-up step, so that the scratch on the surface of the Al film 25 that had been generated on the occasion of the first CMP step could be removed. Further, since this touch-up was performed under the condition where the Al film 25 was still left remained all over the surface, the scratch could be easily removed.

EXAMPLE 5

This example explains the method of forming an STI. By the way, since the cross-sectional views in this example are the same as FIGS. 3A to 3E employed in the explanation of Example 1, this example will be explained with reference to FIGS. 3A to 3E.

First of all, the steps shown in FIGS. 3A and 3B, which were to be performed prior to the CMP were performed in the same manner as in Example 1.

A Thereafter, as shown in FIG. 3C, the $SiO_2$ film 4 having a thickness of 350 nm was polished by means of the CMP method up to a point immediately before the silicon nitride film 2 was exposed so as to eliminate the step portion (recessed and projected portion) of the $SiO_2$ film 4 (the first polishing step). The abrasive slurry employed in this example was formed of the following composition.

The Composition of the Abrasive Slurry:

Solvent: Water

Abrasive grain: cerium oxide, 0.3 $\mu$m in particle diameter, and 1.0% by weight in mixing ratio Surfactant: anionic surfactant, and 1.0% by weight in mixing ratio.

As for the abrasive pad, IC1000/SUBA400 (Rodel Nitta Co., Ltd.) was employed. The load was set to 400 g/cm$^2$, and the rotational speed of the top ring and turn table was set to 50 rpm.

In the polishing under such conditions, if there are recessed and projected portions on the surface of wafer, the polishing rate of the projected portions would become very fast, e.g. 450 nm/min. However, once the surface of wafer becomes flat, the polishing rate would be sharply reduced to 10 nm/min. Namely, without necessitating a strict control of the polishing time, the film thickness D left remained after the polishing of 90 seconds can be controlled within the range of 50 to 100 nm.

Then, as shown in FIG. 3D, the $SiO_2$ film 4 was subjected to a polishing treatment by making use of a silica-based polishing slurry having the following composition until the silicon nitride film 2 was exposed (the second polishing step).

Solvent: Water

Abrasive grain: silica, 30 $\mu$m in particle diameter, and 10% by weight in mixing ratio, SC-1 (trade mark, manufactured by Cabot Co.).

This polishing slurry was capable of minimizing the difference in polishing rate between the projected portions and the recessed portions of the surface of wafer as compared with the polishing slurry employed in the first polishing step, so that the polishing rate even after the surface of wafer became flat due to this polishing was 150 nm/min.

Since the film thickness D left remained after the polishing under the conditions employed in the first step could be controlled within the range of 50 to 100 nm, the polishing time of the second polishing step could be fixedly set to 60 seconds. The residual SiN film after the second polishing could be controlled within the range of 45 to 35 nm in thickness, thus making it possible to minimize the development of the dishing.

Finally, as shown in FIG. 3E, the silicon nitride film 2 is removed in the same manner as conventionally employed to thereby finishing the formation of a buried element isolation structure.

As explained above, according to this invention, since the polishing of the buried film is performed by two polishing steps, the time to terminate the polishing process can be determined based not on the initial film thickness of the buried film but on the film thickness which has been made thinner as a result of preliminary polishing, it is now possible to minimize the generation of erosion.

Additional advantages and modifications will readily occur to those skilled in the art. Therefore, the invention in its broader aspects is not limited to the specific details and representative embodiments shown and described here in. Accordingly, various modifications may be made without departing from the spirit or scope of the general inventive concept as defined by the appended claims and their equivalents.

What is claimed is:

1. A method of manufacturing a semiconductor device, which comprises:

providing a substrate having a groove or hole on a surface thereof;

forming a burying film on the substrate to thereby fill said groove or hole with said burying film;

performing a first polishing to polish said burying film by means of a CMP method, said polishing being suspended before said substrate is exposed;

measuring a film thickness of said burying film which remains after finishing said first polishing; and performing a second polishing to polish said burying film by means of a CMP method until a part of said burying film which is disposed outside said groove or hole is removed, wherein said first polishing is performed until the surface of said burying film is flattened, and a time to finish polishing of said second polishing is determined based on the measured film thickness of said burying film.

2. The method according to claim 1, wherein said substrate having a groove or hole in the surface thereof is a semiconductor substrate having an element isolation groove on the surface thereof or an interlayer insulating film having a wiring groove in the surface thereof.

3. The method according to claim 1, wherein said first polishing step is performed under a condition which differs from that of said second polishing step.

4. The method according to claim 1, wherein said first polishing step is performed under a condition where a load dependency of polishing rate of said burying film is higher that that is said second polishing step.

5. The method according to claim 1, wherein a polishing rate after the surface of said burying film is flattened in said second polishing step is higher than a polishing rate after the surface of said burying film is flattened in said first polishing step.

6. The method according to claim 1, wherein said second polishing step is performed in such a manner that after a portion of the substrate which is located outside said groove is exposed as a result of polishing, a polishing rate of said portion of the substrate thus exposed is substantially identical with a polishing rate of said burying film.

7. The method according to claim 3, wherein at least one of the factors selected from an abrasive pad, a composition of abrasive slurry and operating conditions is changed thereby differentiating the polishing conditions of said first polishing step from those of said second polishing step.

8. The method according to claim 3, wherein said first polishing step is performed using a grinding stone.

9. A method of manufacturing a semiconductor device, which comprises:

providing a substrate having a groove on a surface thereof;

forming a burying film on the substrate to thereby fill said groove with said burying film;

performing a first polishing to polish said burying film by means of a CMP method, said polishing being suspended before said substrate is exposed;

measuring a film thickness of said burying film which remains after finishing said first polishing;

determining a polish-finishing time of a second polishing on the basis of the measured film thickness of said burying film; and performing the second polishing to polish said burying film by means of a CMP method until said polish-finishing time runs out.

10. The method according to claim 9, wherein said first polishing step is performed under a condition which differs from that of said second polishing step.

11. The method according to claim 10, wherein at least one of the factors selected from an abrasive pad, the composition of abrasive slurry and operating conditions is changed thereby differentiating the polishing conditions of said first polishing step from those of said second polishing step.

12. The method according to claim 9, wherein said first polishing step is performed until the surface of said burying film is flattened.

13. The method according to claim 12, wherein said first polishing step is performed under a condition where a load dependency of polishing rate of said burying film is higher than that in said second polishing step.

14. The method according to claim 12, wherein a polishing rate after the surface of said burying film is flattened in said second polishing step is higher than a polishing rate after the surface of said burying film is flattened in said first polishing step.

15. The method according to claim 12, wherein said second polishing step is performed in such a manner that after a portion of the substrate which is located outside said groove is exposed as a result of polishing, a polishing rate of the portion of the substrate thus exposed is substantially identical with a polishing rate of said burying film.

16. The method according to claim 9, wherein said first polishing step is performed using a grinding stone.

* * * * *